(12) United States Patent
Sumino et al.

(10) Patent No.: US 9,373,397 B1
(45) Date of Patent: Jun. 21, 2016

(54) PAGE PROGRAMMING SEQUENCES AND ASSIGNMENT SCHEMES FOR A MEMORY DEVICE

(71) Applicant: Sony Corporation, Tokyo (JP)

(72) Inventors: Jun Sumino, Boise, ID (US); Makoto Kitagawa, Folsom, CA (US)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/560,750

(22) Filed: Dec. 4, 2014

(51) Int. Cl.
*G11C 11/00* (2006.01)
*G11C 13/00* (2006.01)

(52) U.S. Cl.
CPC .......... *G11C 13/0069* (2013.01); *G11C 13/004* (2013.01); *G11C 13/0097* (2013.01)

(58) Field of Classification Search
CPC ........ G11C 16/10; G11C 16/16; G11C 16/24; G11C 7/12; G11C 2216/14; G11C 7/1033; G11C 7/1048; G11C 7/1051; G11C 11/5642; G11C 2211/5642
USPC ............. 365/185.11, 185.12, 189.05, 230.06, 365/230.08, 185.21, 185.23, 230.03, 238.5, 365/49.1
See application file for complete search history.

(56) References Cited

U.S. PATENT DOCUMENTS

| | | |
|---|---|---|
| 8,102,698 B2 | 1/2012 | Scheuerlein |
| 8,526,245 B2 | 9/2013 | Yoon et al. |
| 2008/0123423 A1* | 5/2008 | Kim ..................... G11C 5/025 365/185.11 |
| 2012/0294073 A1 | 11/2012 | Lee |
| 2013/0343119 A1 | 12/2013 | Redaelli |

* cited by examiner

*Primary Examiner* — Thong Q Le
(74) *Attorney, Agent, or Firm* — Sheridan Ross P.C.

(57) ABSTRACT

Embodiments of the invention are directed towards a memory device comprising a plurality of wordlines each coupled to a row of memory cells in a subtile of the memory device, a plurality of level one column select circuits coupled to each cell in a plurality of groups of cells in a subtile, a plurality of level two column select circuits coupled to each of the plurality of groups of cells in the subtile, a common bit line coupled to the plurality of level one column select circuits and the plurality of level two column select circuits, the common bit line also coupled to a sense and program circuit, wherein the sense and program circuit addresses each first cell in each of the groups of cells to form a single page of memory.

20 Claims, 7 Drawing Sheets

FIG. 1 (REFERENCE ART)

PAGE PROGRAMMING SEQUENCES AND ASSIGNMENT SCHEMES FOR A MEMORY DEVICE

FIELD

Certain embodiments of the disclosure relate to page programming sequences and assignment schemes for a memory device.

BACKGROUND

Resistive RAMs (ReRAMs) have emerged as leading candidates to displace conventional Flash memories due to their high density, good scalability, low power and high performance. Previous ReRAM designs demonstrating high performance have done so on low density arrays (such as those less than one Gigabit) while those reporting high-density arrays (such as greater than eight Gigabits) were accompanied by relatively low read and write performance.

FIG. 1 illustrates an exemplary embodiment of ReRAM array architecture of a memory device 100. Each chip may comprise several memory blocks. FIG. 1 illustrates memory block 102, comprising memory banks 104. Each memory bank comprises Y-strips 106, or vertical groups of tiles with a common global bitline (CBL). The Y-strip 108 comprises sixteen tiles and one redundant tile, where each tile is a matrix of 8,192 by 256 local bitlines and 2,048 wordlines. The tile 110 comprises 4 subtiles. During a sense operation and a program operation in a bank, 8 tiles (one per Y-strip) are activated simultaneously, each accessing a sub-page for a total sense/program concurrency of 512+16 cells. Since the page size is four times the number of sense/program circuits, there are 4 nibbles, where a nibble is defined as serial accesses to successive bitline addresses during the sense and program sequence performed by the sense and program circuits 112. The complete sense/program unit is a page of 8 sub-pages.

However, during the program operation performed by the sense and program circuits 112, if a page of a sub-tile is activated, the current applied to perform the operation may cause a thermal disturbance to memory cells in neighboring pages, increasing the temperature of the memory cells in the neighboring pages. While program operations can be performed on these neighboring pages, performance (number of verify loops) and reliability (data retention) are significantly degraded by the temperature increase. Consequently, a period of time elapses, generally, before operations are performed on the neighboring pages, thus increasing the program operation time.

Therefore, there is a need in the art for page programming sequences and assignments in memory devices that reduce program operation time in accordance with exemplary embodiments of the present invention.

SUMMARY

Page programming sequences and assignment schemes for a memory device are provided as set forth more completely in the claims.

These and other features and advantages of the present disclosure may be appreciated from a review of the following detailed description of the present disclosure, along with the accompanying figures in which like reference numerals refer to like parts throughout.

DETAILED DESCRIPTION

Certain implementations of the invention may be found in several program operation sequences and addressing for a memory device. According to one embodiment, program (or, set) operations are performed on pages of the memory device by skipping adjacent pages. For example, the pulse issued by the sense and program circuit will control a column select circuit so that every other page is programmed sequentially, as opposed to adjacent pages being programmed sequentially. Accordingly, no thermal disturbance will be observed in the adjacent pages because the set operation is not applied until after the cells within the page have cooled. Similarly, other embodiments of the present invention modify the column select circuit such that a page is formed using non-adjacent cells.

Figure 1:
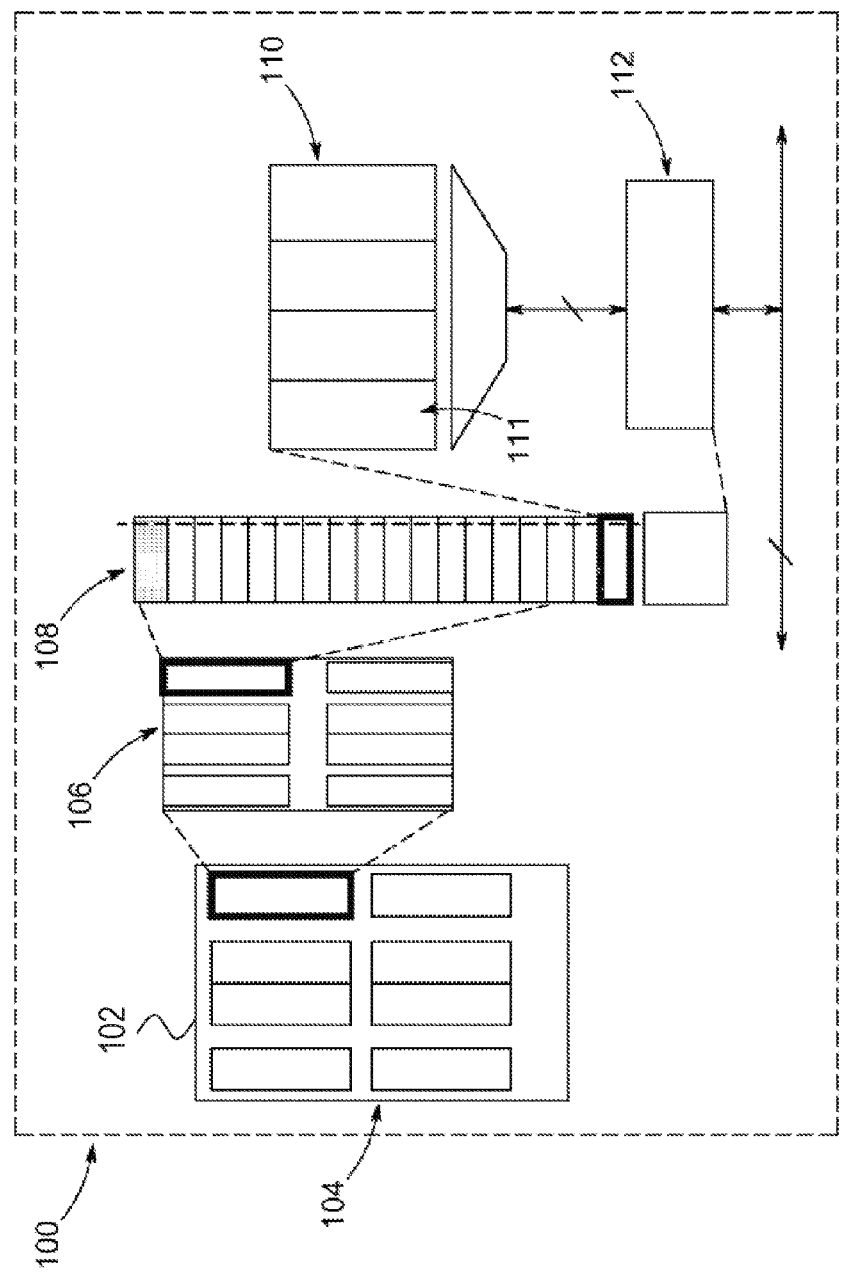
FIG. 1 depicts an exemplary array architecture for ReRAM in accordance with exemplary embodiments of the present invention.
Figure 2:
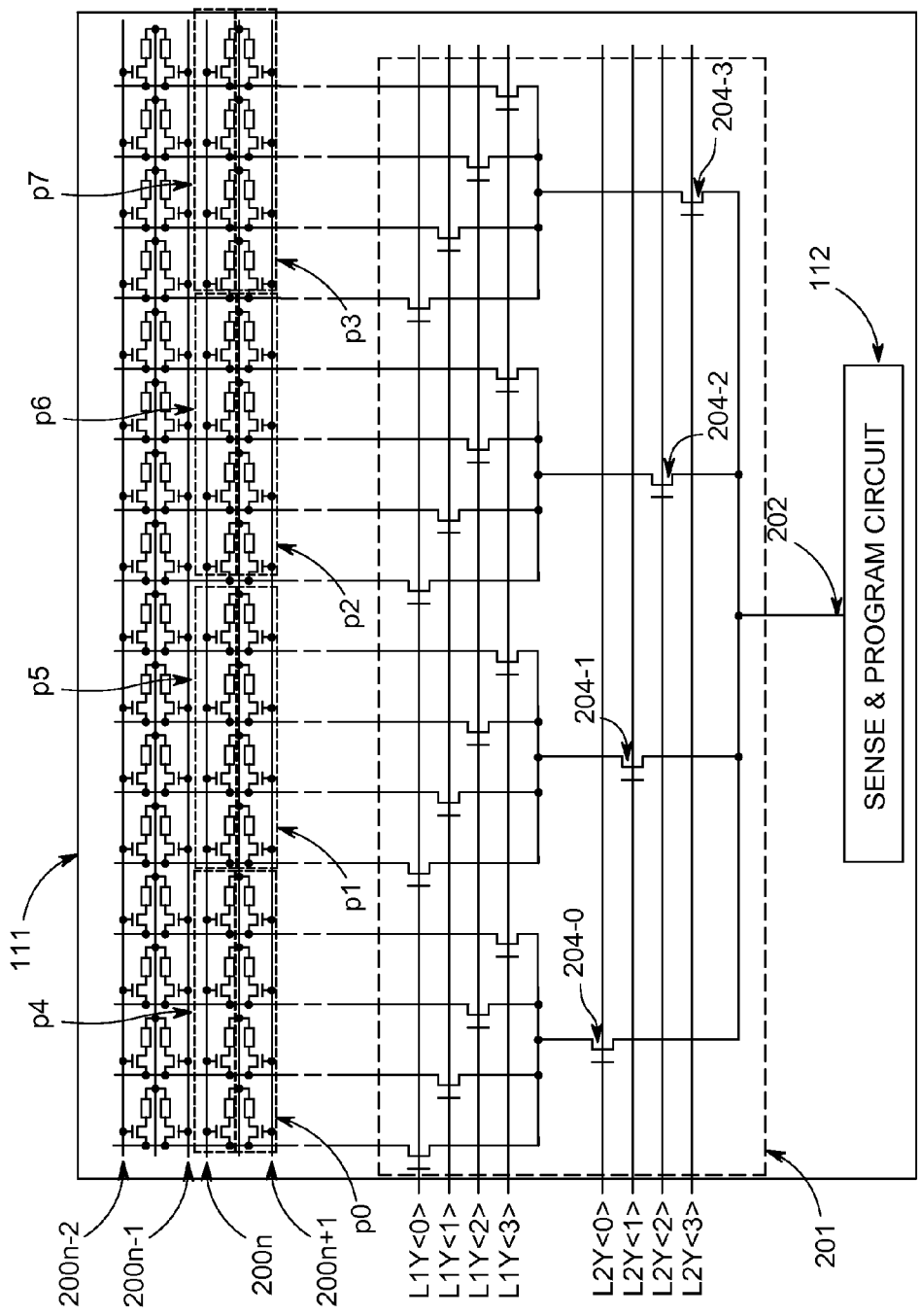
FIG. 2 depicts the column select circuit for a single sub-tile in a memory tile in accordance with exemplary embodiments of the present invention.

FIG. 2 depicts the column select circuit 201 for a single sub-tile 111 in the memory tile 110 in accordance with exemplary embodiments of the present invention.

Sub-tile 111 comprises a finite number of wordlines; those shown in FIG. 2 include 200$n$–2 to 200$n$+1 (collectively, wordlines 200). Those of ordinary skill in the art will recognize that each subtile may contain many wordlines to access a variety of different cells on the memory device. The sub-tile 111 comprises a plurality of memory cells, the cells aggregated into eight "pages" p0 to p7. The sense and program circuit 112 issues pulses to perform operations such as programming memory cells, sensing the value stored in memory cells and the like. The pulses are issued to the various memory cells via the common bit line (CBL) 202. The column select circuit 201 comprises a level one select (I1$y$) and a level 2 select (I2$y$). The CBL 202 is coupled to the I2$y$ column selects respectively via switches 204-0 to 204-3. The wordlines 200 select a "row" of cells. The level 2 select (I2$y$) selects a group of four cells (one page) while the level 1 select (I1$y$) selects a particular cell. For example, an operation on the first cell of page p0 will be performed if wordline 200$n$+1 is selected, I2$y$<0> is selected and I1$y$<0> is selected. Similarly, an operation on the first cell of page p1 will be performed if wordline 200$n$+1 is selected, and I2$y$<1> and I1$y$<1> are selected.

However, if the set of cells in page p0 are programmed (i.e., set to a value), a thermal disturbance may be caused to cells in adjacent pages p4 and p1. Similarly, if the cells in page p1 are programmed, a thermal disturbance may be caused to cells in adjacent pages p0, p5 and p6. To avoid such a thermal disturbance, the addressing sequences shown in FIG. 3 are employed.

Figure 3:
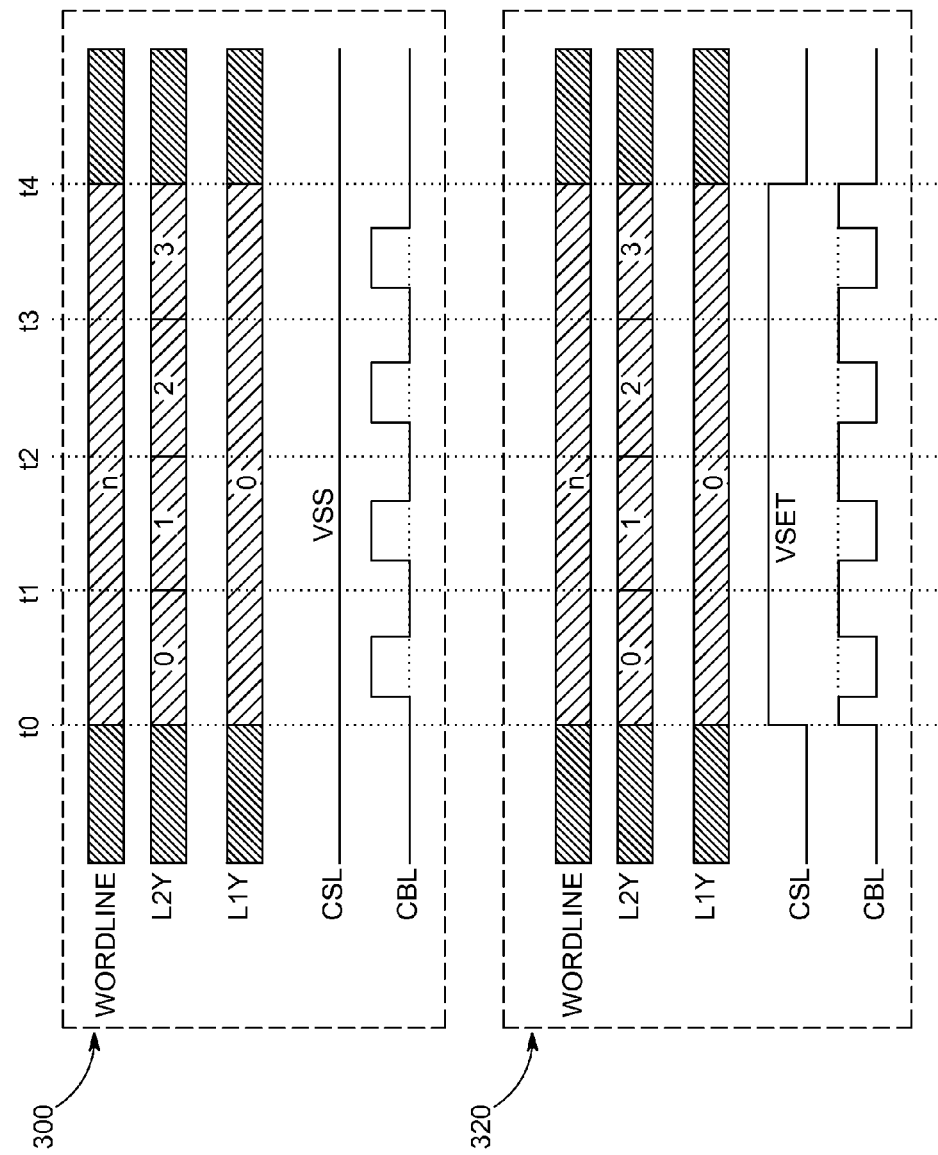
FIG. 3 depicts an addressing sequence for performing operations on memory cells using the column select circuit depicted in FIG. 2 in accordance with exemplary embodiments of the present invention.

FIG. 3 depicts an addressing sequence for performing operations on memory cells using the column select circuit depicted in FIG. 2 in accordance with exemplary embodiments of the present invention.

During the reset operation depicted in diagram 300, at a time t0 to t4, wordline n is selected, while the level 2 column select (I2y) sequentially selects I2y<0> to I2y<3>, respectively, at times t0, t1, t2 and t3. I1y<0> remains selected from time t0 to t4. The common source line (CSL) is set to Vss, while the CBL is raised to a voltage required for a reset operation, Vreset, to select the first memory cell from each page p0. After time t4, the next wordline (e.g., 200n+1) is selected and the next level 1 column select is selected (e.g., I1y<1> to I1y<3>) and so on until all the required cells are programmed, reset or sensed. Effectively, by modifying conventional addressing methods, a new page is formed using the first memory cells in page p0 to p4. Similarly, a second page is formed using the second memory cells in page p0 to p4, and so on.

During a set operation depicted in diagram 320, wordline n is selected from time t0 to t4. Similarly, I2y<0> to I2y<3> are sequentially selected respectively at times t0 to t3, while I1y<0> is selected from time t0 to t4 by raising the common bit line. At time t0, the CSL is raised to Vset (the voltage required to perform the set operation), while the CBL is raised to Vset or lowered from Vset to select each I2y select depending on its current value. The sequential selection of I2y<0> to I2y<3> while selecting I1y<0> results in a set operation being performed on each of the memory cells in p4 to p7. Effectively, by modifying conventional addressing methods, a new page is formed using the first memory cells in page p4 to p7. Similarly, a second page is formed using the second memory cells in page p4 to p7, a third page is formed using the third memory cells in page p4 to p7, and so on.

Figure 4:
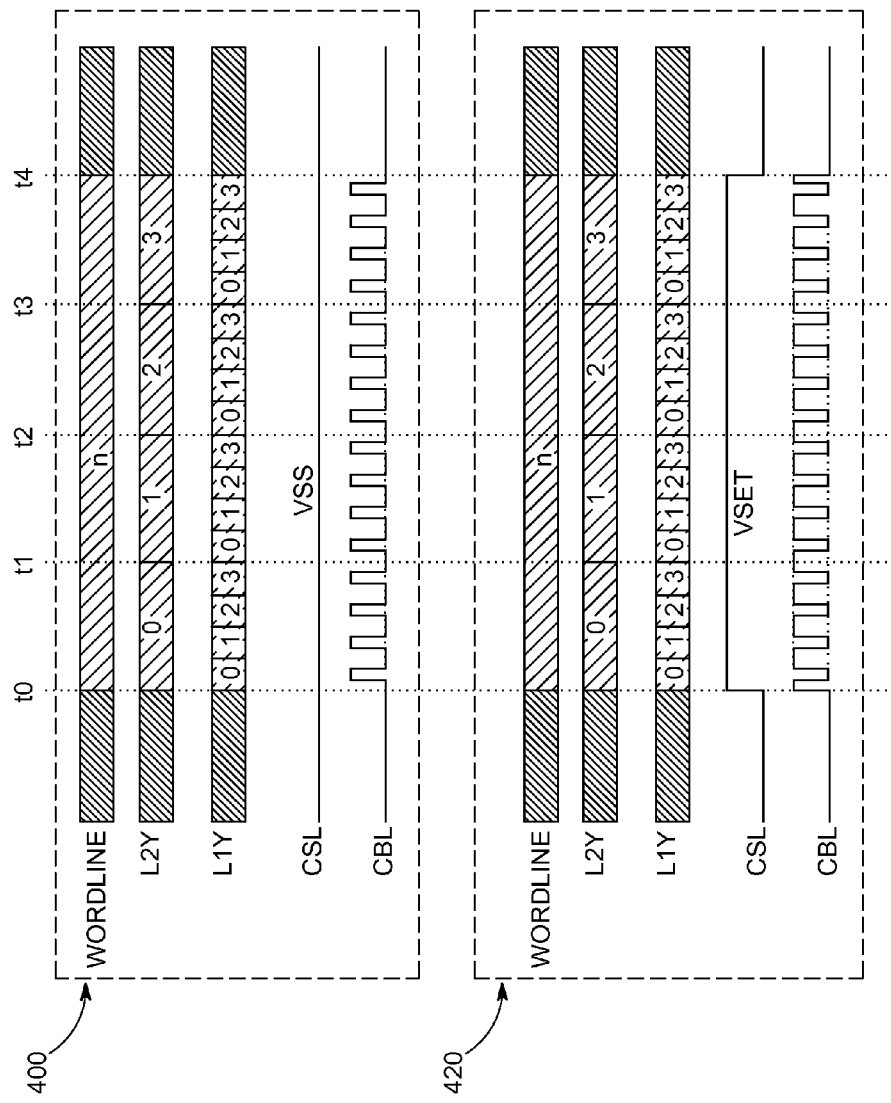
FIG. 4 depicts an addressing sequence for performing operations on the memory cells using the column select circuit depicted in FIG. 2 for page assignment in the X direction in accordance with exemplary embodiments of the present invention.

FIG. 4 depicts an addressing sequence for performing operations on the memory cells using the column select circuit depicted in FIG. 2 for page assignment in the X direction in accordance with exemplary embodiments of the present invention. In the addressing sequence shown in FIG. 4, an assumption is made that pages and memory cells neighboring each other in the "X-Direction", e.g. between cells sharing a wordline, is negligible.

In the reset operation depicted in diagram 400, at time t0, wordline 200n, I2y<0> and I1y<0> are selected. CSL remains at Vss, while CBL is raised to Vreset. From time t0 to t1, time t1 to t2, t2 to t3, and t3 to t4, I1y<0> to I1y<3> are sequentially selected. CBL initially is at Vss, but is raised after time t0 to Vreset and lowered back to set for each I1y<0> to I1y<3> selection. Effectively, each cell in each of pages p0 to p7 is selected sequentially and a reset operation is performed sequentially. Those of ordinary skill in the art will recognize that thermal disturbance is negligible in the X-direction (e.g., among those cells sharing a wordline).

In the set operation depicted in diagram 420, at time t0, wordline n, I2y<0> and I1y<0> are selected. CSL goes to Vset, while CBL is raised to Vset. From time t0 to t1, time t1 to t2, t2 to t3, and t3 to t4, I1y<0> to I1y<3> are sequentially selected. CBL is lowered after time t0 to Vss and then raised to Vset for each I1y<0> to I1y<3> selection. Effectively, each cell in each of pages p0 to p7 is selected sequentially and a set operation is performed sequentially.

Figure 5:
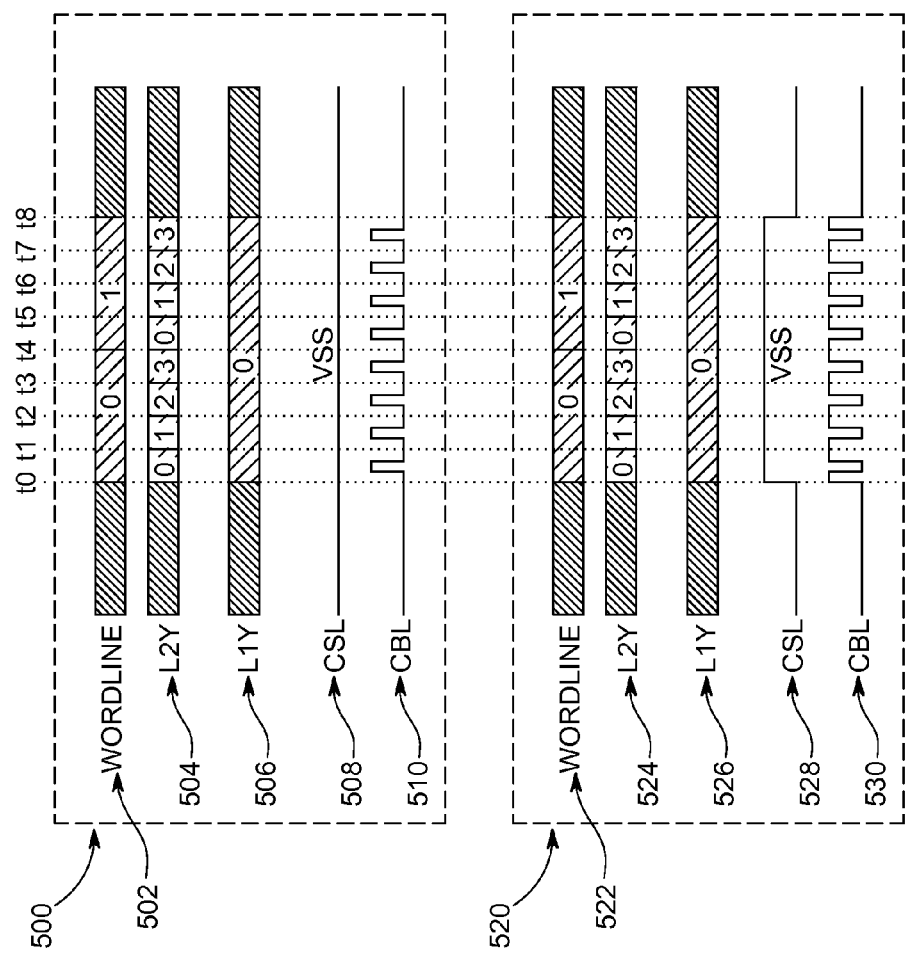
FIG. 5 depicts an addressing sequence for performing operations on the memory cells using the column select circuit depicted in FIG. 2 for page assignment in the Y direction in accordance with exemplary embodiments of the present invention.

FIG. 5 depicts an addressing sequence for performing operations on the memory cells using the column select circuit depicted in FIG. 2 for page assignment in the Y direction in accordance with exemplary embodiments of the present invention. In the addressing sequence shown in FIG. 5, an assumption is made that pages and memory cells neighboring each other in the "Y-Direction", e.g. between cells sharing a bitline, is negligible.

In the reset operation depicted in diagram 500, at time t0, wordline n, I2y<0> and I1y<0> are selected. CSL remains at Vss, while CBL is raised to Vreset shortly after time t0. From time t0 to t1, time t1 to t2, t2 to t3, and t3 to t4, I2y<0> to I2y<3> are sequentially selected. At time t4 to time t8, wordline n+1 is selected. From time t4 to t5, time t5 to t6, t6 to t7, and t7 to t8, I2y<0> to I2y<3> are sequentially selected. CBL is lowered after time t0 from Vset to Vss and then raised to Vset for each between each time interval t0 to t1, t1 to t2, t3 to t4 and so on. Effectively, a first page is formed by addressing the first memory cells in each of pages p0 to p7.

Similarly, in the set operation depicted in diagram 520, at time t0, wordline 0, I2y<0> and I1y<0> are selected. CSL goes to Vset at time t0, while CBL is raised to Vset at time t0. At time t0 to time t4, wordline n is selected. From time t0 to t1, time t1 to t2, t2 to t3, and t3 to t4, I2y<0> to I2y<3> are sequentially selected. At time t4 to time t8, wordline n+1 is selected. From time t4 to t5, time t5 to t6, t6 to t7, and t7 to t8, I2y<0> to I2y<3> are sequentially selected. CBL is lowered after time t0 from Vset to Vss and then raised to Vset prior to t1, for each time interval t0 to t1, t1 to t2, t3 to t4 and so on. Effectively, a first page is formed by addressing the first memory cells in each of pages p0 to p7 without modifying the circuit.

Figure 6:
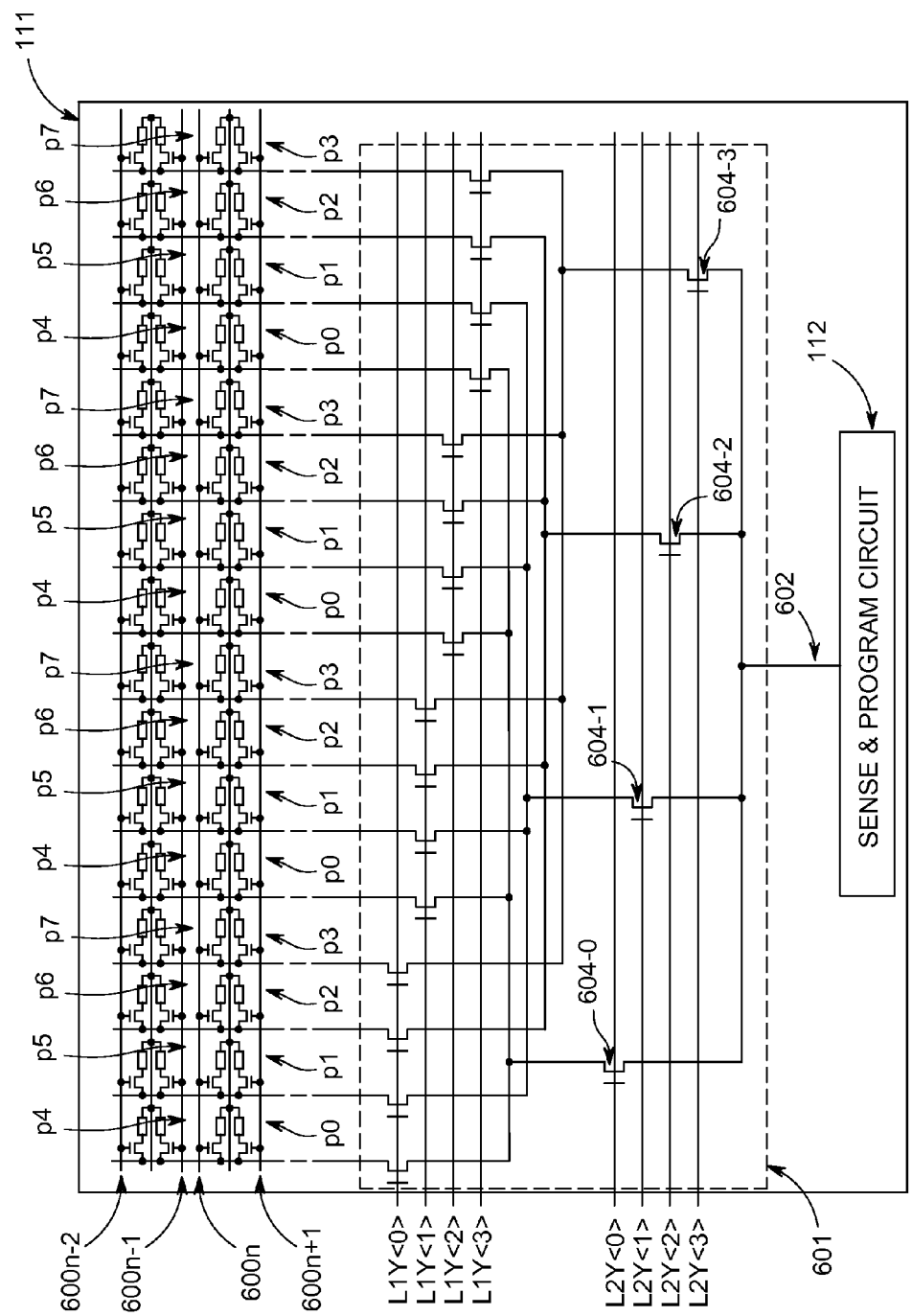
FIG. 6 depicts another embodiment of a column select circuit for single sub-tile in a memory tile in accordance with exemplary embodiments of the present invention.

FIG. 6 depicts another embodiment of a column select circuit 601 for a single sub-tile 111 in a memory tile 110 in accordance with exemplary embodiments of the present invention.

Sub-tile 111 comprises a finite number of wordlines; those shown in FIG. 6 include 600n−2 to 600n+1 (collectively, wordlines 600). Those of ordinary skill in the art will recognize that each subtile may contain many wordlines to access a variety of different cells on the memory device. The sub-tile 111 comprises a plurality of memory cells, the cells aggregated into eight (for example) "pages" p0 to p7. The sense and program circuit 112 issues pulses to perform operations such as programming memory cells, sensing the value stored in memory cells and the like. The pulses are issued to the various memory cells via the common bit line (CBL) 602. The column select circuit 601 comprises a level one select (I1y) and a level 2 select (I2y). The CBL 602 is coupled to the I2y column selects respectively via switches 604-0 to 604-3. The wordlines 600 select a "row" of cells. The level 2 select (I2y) selects a group of four cells (one page) while the level 1 select (I1y) selects a particular cell. For example, an operation on the first cell of page p0 will be performed if wordline 600n+1 is selected, I2y<0> is selected and I1y<0> is selected. Similarly, an operation on the first cell of page p1 will be performed if wordline 600n+1 is selected, and I2y<1> and I1y<0> are selected.

Column select circuit 601 differs from column select circuit 201 in that each I2y selects non-adjacent memory cells. For example, the memory cells associated with page 0 are now located 3 cells away from each other, where in FIG. 2 the memory cells for page 0 were directly adjacent to each other.

Figure 7:
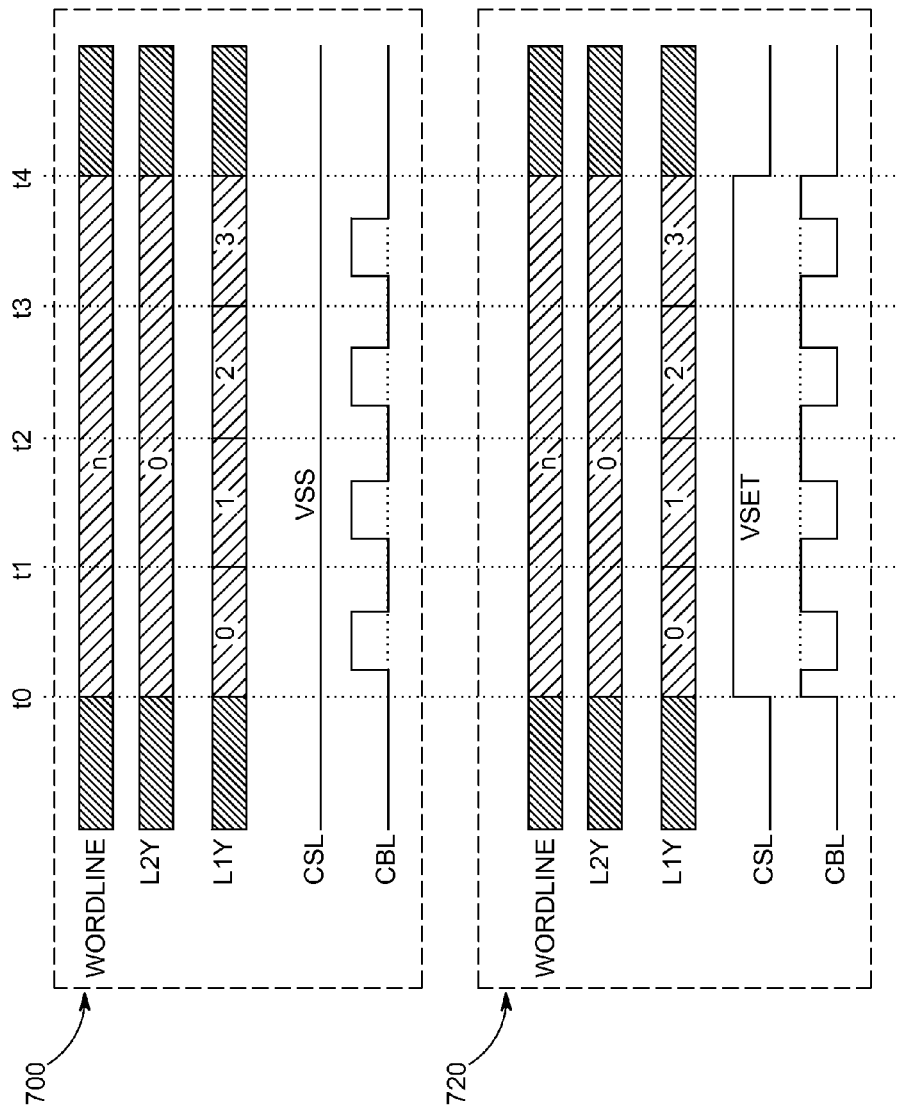
FIG. 7 depicts an addressing sequence for performing operations on the memory cells using the column select circuit depicted in FIG. 6 in accordance with exemplary embodiments of the present invention.

Accordingly, the addressing performed by the sense & program circuit 112 is a conventional addressing shown in FIG. 7, as the circuit 601 is modified.

FIG. 7 depicts an addressing sequence for performing operations on the memory cells using the column select circuit depicted in FIG. 6 in accordance with exemplary embodiments of the present invention.

In diagram 700 of a reset operation, at time t0 to time t4, wordline n and I2y<0> are selected. The level 1 column select I1y sequentially selects I1y<0> at time t0, I1y<1> at time t1, I1y<2> at time t2, and I1y<3> at time t3. CSL remains at Vss, while CBL 602 goes to Vreset after time t0 and drops to Vss before time t1, and similarly for time t1 to t2, t2 to t3 and t3 to t4.

In diagram 700 of a reset operation, at time t0 to time t4, wordline n and I2y<0> are selected. The level 1 column select I1y sequentially selects I1y<0> at time t0, I1y<1> at time t1, I1y<2> at time t2, and I1y<3> at time t3. CSL goes to Vset at time t0, while CBL 602 goes to Vset at time t0 and drops to Vss shortly after time 0, and returns to Vset before time t1, and similarly for time t1 to t2, t2 to t3 and t3 to t4. Effectively, every fourth bit is selected to form a page to avoid thermal disturbance of adjacent pages.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A memory device comprising:
a plurality of wordlines each coupled to a row of memory cells in a subtile of the memory device;
a plurality of level one column select circuits coupled to each cell in a plurality of groups of cells in a subtile;
a plurality of level two column select circuits coupled to each of the plurality of groups of cells in the subtile; and
a common bit line (CBL) coupled to the plurality of level one column select circuits and the plurality of level two column select circuits, the common bit line also coupled to a sense and program circuit,
wherein the sense and program circuit addresses each first cell in each of the groups of cells to form a single page of memory, and wherein for a reset operation from time t0 to t4, a common source line voltage of the memory device is lowered to VSS and a first wordline is selected.

2. The memory device of claim 1, wherein a first level two column select circuit is enabled from time period t0 to t1, a second level two column select circuit is enabled from t1 to t2, a third level two column select circuit is enabled from t2 to t3, and a fourth level two column select circuit is enabled from t3 to t4, wherein each level two column select is enabled by raising the common bit line to a reset voltage and lowering the common bit line to VSS during each time period.

3. A memory device comprising:
a plurality of wordlines each coupled to a row of memory cells in a subtile of the memory device;
a plurality of level one column select circuits coupled to each cell in a plurality of groups of cells in a subtile;
a plurality of level two column select circuits coupled to each of the plurality of groups of cells in the subtile; and
a common bit line (CBL) coupled to the plurality of level one column select circuits and the plurality of level two column select circuits, the common bit line also coupled to a sense and program circuit,
wherein the sense and program circuit addresses each first cell in each of the groups of cells to form a single page of memory, and wherein for a set operation from time t0 to t4, a common source line voltage is raised to set voltage, a first wordline is selected and a first level one select is enabled.

4. The memory device of claim 3, wherein a first level two column select circuit is enabled from time period t0 to t1, a second level two column select circuit is enabled from t1 to t2, a third level two column select circuit is enabled from t2 to t3, and a fourth level two column select circuit is enabled from t3 to t4, wherein each level two column select is enabled by raising the common bit line to a reset voltage and lowering the common bit line to VSS during each time period.

5. A memory device comprising:
a plurality of wordlines each coupled to a row of memory cells in a subtile of the memory device;
a plurality of level one column select circuits coupled to each cell in a plurality of groups of cells in a subtile;
a plurality of level two column select circuits coupled to each of the plurality of groups of cells in the subtile; and
a common bit line (CBL) coupled to the plurality of level one column select circuits and the plurality of level two column select circuits, the common bit line also coupled to a sense and program circuit,
wherein the sense and program circuit addresses each first cell in each of the groups of cells to form a single page of memory, and wherein the memory device is a resistance ram memory device.

6. A memory device comprising:
a plurality of wordlines each coupled to a row of memory cells in a subtile of the memory device;
a plurality of level one column select circuits coupled to each cell in a plurality of groups of cells in a subtile;
a plurality of level two column select circuits coupled to each of the plurality of groups of cells in the subtile; and
a common bit line coupled to the plurality of level one column select circuits and the plurality of level two column select circuits, the common bit line also coupled to a sense and program circuit,
wherein the sense and program circuit addresses each cell sequentially in a group of cells to form a single page of memory, moving sequentially to a next neighboring group of cells in a plurality of groups of cells.

7. The memory device of claim 6, wherein for a reset operation from time t0 to t4, a common source line voltage of the memory device is lowered to VSS and a first wordline is selected.

8. The memory device of claim 7, wherein a first level two column select circuit is enabled from time period t0 to t1, a second level two column select circuit is enabled from t1 to t2, a third level two column select circuit is enabled from t2 to t3, and a fourth level two column select circuit is enabled from t3 to t4.

9. The memory device of claim 8, wherein the common bit line is raised after time t0 to a reset voltage and lowered to VSS a plurality of times before time t1, and similarly for each time period thereafter, to select each of the plurality of level one column select circuits.

10. The memory device of claim 6, wherein for a reset operation from time t0 to t4, a common source line voltage of the memory device is raised to a set voltage and a first wordline is selected.

11. The memory device of claim 10, wherein a first level two column select circuit is enabled from time period t0 to t1, a second level two column select circuit is enabled from t1 to t2, a third level two column select circuit is enabled from t2 to t3, and a fourth level two column select circuit is enabled from t3 to t4.

12. The memory device of claim 11, wherein the common bit line is raised at time t0 to the set voltage, lowered to VSS, and raised again to the set voltage a plurality of times before time t1, and similarly for each time period thereafter, to select each of the plurality of level one column select circuits.

13. The memory device of claim 6, wherein for a reset operation from time t0 to t8, a common source line voltage of the memory device is lowered to VSS and a first wordline and second wordline are selected sequentially.

14. The memory device of claim 13, wherein a first level two column select circuit is enabled from time period t0 to t1 and time period t4 to t5, a second level two column select circuit is enabled from t1 to t2 and time period t5 to t6, a third level two column select circuit is enabled from t2 to t3 and time period t6 to t7, and a fourth level two column select circuit is enabled from t3 to t4 and time period t7 to t8 by raising the common bitline to a reset voltage during each time period.

15. The memory device of claim 6, wherein for a set operation from t0 to t8, a common source line voltage of the memory device is raised to a set voltage and a first wordline and second wordline are selected sequentially.

16. The memory device of claim 15, wherein a first level two column select circuit is enabled from time period t0 to t1 and time period t4 to t5, a second level two column select circuit is enabled from t1 to t2 and time period t5 to t6, a third level two column select circuit is enabled from t2 to t3 and time period t6 to t7, and a fourth level two column select circuit is enabled from t3 to t4 and time period t7 to t8 by raising the common bitline to a set voltage at a beginning of each time period, lowering the common bitline to VSS and raising the common bitline to the set voltage before an end of each time period.

17. A memory device comprising:
a plurality of wordlines each coupled to a row of memory cells in a subtile of the memory device;
a plurality of level one column select circuits coupled to each cell in a plurality of groups of cells in a subtile;
a plurality of level two column select circuits coupled to each of the plurality of groups of cells in the subtile; and
a common bit line coupled to the plurality of level one column select circuits and the plurality of level two column select circuits, the common bit line also coupled to a sense and program circuit,
wherein each of the plurality of level two column select circuits are coupled to a plurality of level one column selects, and the level one column selects are coupled to non-adjacent memory cells, and wherein for a reset operation from time t0 to t4, a common source line voltage of the memory device remains at VSS voltage and a first wordline is selected.

18. The memory device of claim 17, wherein a first level one column select circuit is enabled from time period t0 to t1, a second level one column select circuit is enabled from t1 to t2, a third level one column select circuit is enabled from t2 to t3, and a fourth level two one select circuit is enabled from t3 to t4 by raising the common bit line to a reset voltage and lowering the common bit line to VSS during each time period.

19. A memory device comprising:
a plurality of wordlines each coupled to a row of memory cells in a subtile of the memory device;
a plurality of level one column select circuits coupled to each cell in a plurality of groups of cells in a subtile;
a plurality of level two column select circuits coupled to each of the plurality of groups of cells in the subtile; and
a common bit line coupled to the plurality of level one column select circuits and the plurality of level two column select circuits, the common bit line also coupled to a sense and program circuit,
wherein each of the plurality of level two column select circuits are coupled to a plurality of level one column selects, and the level one column selects are coupled to non-adjacent memory cells, and wherein for a set operation from time t0 to t4, a common source line voltage of the memory device is raised to a set voltage and a first wordline is selected.

20. The memory device of claim 19, wherein a first level one column select circuit is enabled from time period t0 to t1, a second level one column select circuit is enabled from t1 to t2, a third level one column select circuit is enabled from t2 to t3, and a fourth level one column select circuit is enabled from t3 to t4 by raising the common bit line to the set voltage at a beginning of each time period, lowering the common bit line to VSS after the beginning, and raising the common bit line to the set voltage before an end of each time period.

* * * * *